(12) United States Patent
Tada et al.

(10) Patent No.: US 10,641,931 B2
(45) Date of Patent: May 5, 2020

(54) FRESNEL LENS AND MANUFACTURING METHOD FOR FRESNEL LENS

(71) Applicant: Sony Interactive Entertainment Inc., Tokyo (JP)

(72) Inventors: Shotaro Tada, Aichi (JP); Manabu Ishioka, Tokyo (JP); Toshihiro Kusunoki, Tokyo (JP)

(73) Assignee: Sony Interactive Entertainment Inc., Tokyo (JP)

( * ) Notice: Subject to any disclaimer, the term of this patent is extended or adjusted under 35 U.S.C. 154(b) by 45 days.

(21) Appl. No.: 16/061,792

(22) PCT Filed: Feb. 6, 2017

(86) PCT No.: PCT/JP2017/004169
§ 371 (c)(1),
(2) Date: Jun. 13, 2018

(87) PCT Pub. No.: WO2017/138480
PCT Pub. Date: Aug. 17, 2017

(65) Prior Publication Data
US 2018/0372925 A1 Dec. 27, 2018

(30) Foreign Application Priority Data
Feb. 9, 2016 (JP) .................................. 2016-023151

(51) Int. Cl.
*G02B 3/08* (2006.01)
*G02B 3/00* (2006.01)
(Continued)

(52) U.S. Cl.
CPC ................ *G02B 3/08* (2013.01); *C23C 14/04* (2013.01); *C23C 14/5873* (2013.01); *F21V 5/045* (2013.01); *G02B 3/00* (2013.01)

(58) Field of Classification Search
CPC . G02B 3/08; G02B 1/041; Y02E 10/52; F24S 23/31; H01L 31/0543
(Continued)

(56) References Cited

U.S. PATENT DOCUMENTS 5,676,804 A * 10/1997 Fujii ....................... C23C 14/04
                                                         204/192.14
8,649,095 B2   2/2014 Ando
(Continued)

FOREIGN PATENT DOCUMENTS

JP         06250003 A      9/1994
JP         07306307 A     11/1995
(Continued)

OTHER PUBLICATIONS

Extended Search Report for corresponding EP Application No. 17750203.6, 9 pages, dated Aug. 20, 2019.
(Continued)

*Primary Examiner* — Mohammed A Hasan
(74) *Attorney, Agent, or Firm* — Matthew B. Dernier, Esq.

(57) ABSTRACT

There are provided a Fresnel lens and a method of manufacturing the Fresnel lens which can suppress a flare which is generated in an image visually recognized through the Fresnel lens so as to extend toward a center of a lens. A lens surface and a non-lens surface are formed in each of lens portions. The non-lens surface includes a rise surface and a coupling surface. The rise surface is a surface along an optical axis of a Fresnel lens. The coupling surface is a surface which is formed on a top portion of each of the lens portions and couples the lens surface of the lens portion and the rise surface of the lens portion to each other, and which has a width extending in a radial direction of the Fresnel lens. A light absorbing portion is provided in a position
(Continued)

along the optical axis of the Fresnel lens which passes through the coupling surface.

4 Claims, 15 Drawing Sheets

(51) Int. Cl.
 *C23C 14/04* (2006.01)
 *C23C 14/58* (2006.01)
 *F21V 5/04* (2006.01)
(58) Field of Classification Search
 USPC .......................................................... 359/742
 See application file for complete search history.

(56) References Cited

U.S. PATENT DOCUMENTS

| 2003/0058532 | A1 | 3/2003 | Suzuki |
|---|---|---|---|
| 2006/0001963 | A1 | 1/2006 | Ishikawa |
| 2006/0056185 | A1* | 3/2006 | Morino .................. F21V 5/045 362/332 |
| 2012/0243096 | A1 | 9/2012 | Ando |

FOREIGN PATENT DOCUMENTS

| JP | 08136707 | A | 5/1996 |
|---|---|---|---|
| JP | 2002182012 | A | 6/2002 |
| JP | 2002277614 | A | 9/2002 |
| JP | 3331079 | B2 | 10/2002 |
| JP | 2003173954 | A | 6/2003 |
| JP | 2004151205 | A | 5/2004 |
| JP | 2006039146 | A | 2/2006 |
| JP | 2008064911 | A | 3/2008 |
| JP | 2012226047 | A | 11/2012 |
| JP | 2012252226 | A | 12/2012 |
| JP | 5225536 | B2 | 7/2013 |
| JP | 2015059959 | A | 3/2015 |
| WO | 2004066025 | A1 | 8/2004 |
| WO | 2011086654 | A1 | 7/2011 |

OTHER PUBLICATIONS

International Search Report for corresponding PCT Application No. PCT/JP2017/004169, 4 pages, dated May 16, 2017.
Office Action for corresponding JP Application No. JP2017-566929, 15 pages, dated Dec. 4, 2018.
International Preliminary Report on Patentability for corresponding PCT Application No. PCT/JP2017/004169, 6 pages, dated Aug. 23, 2018.

* cited by examiner

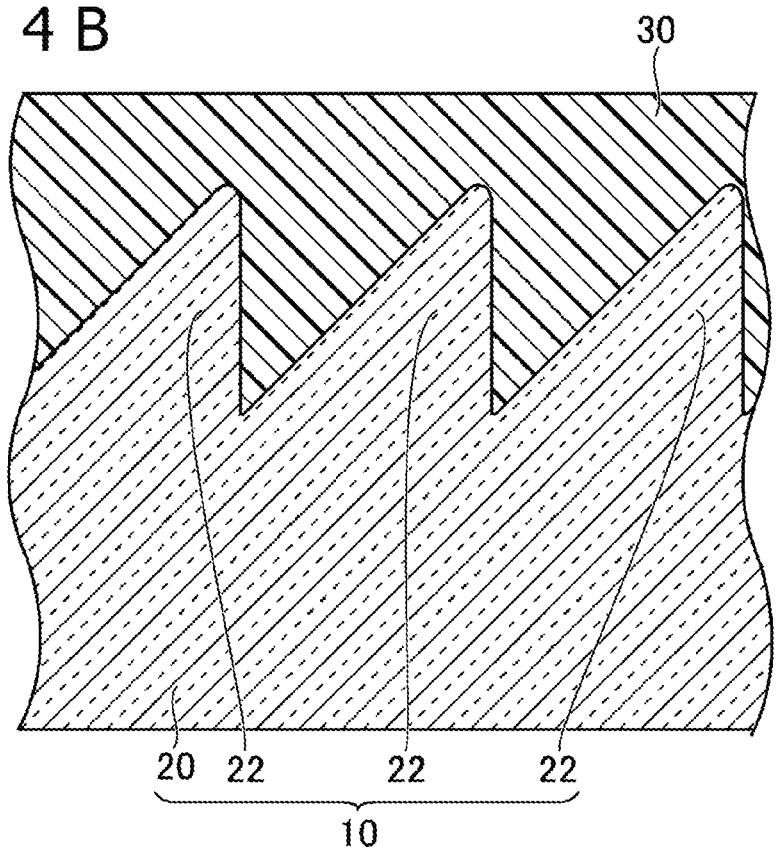

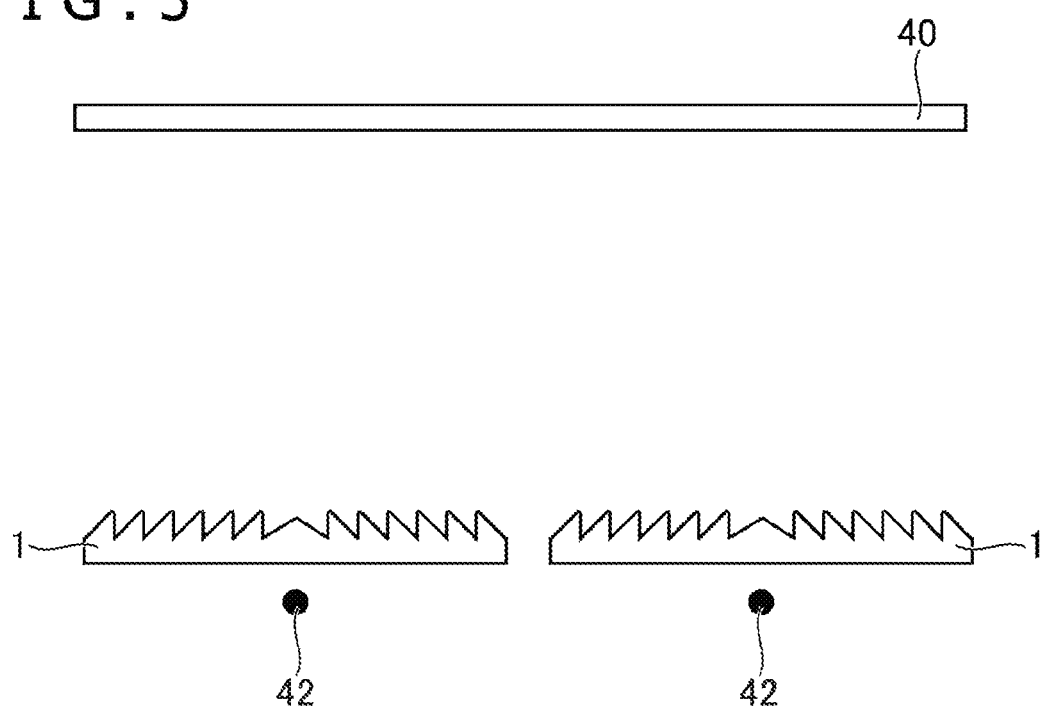

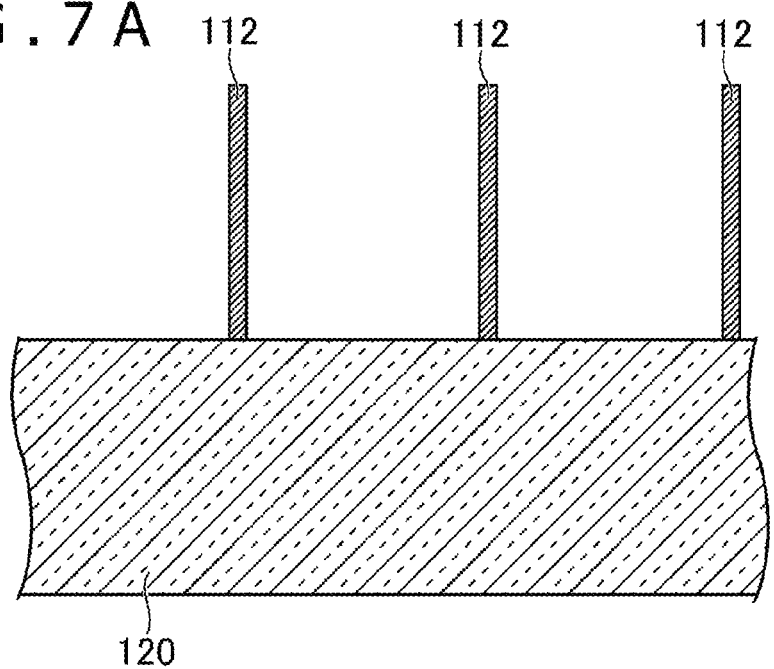

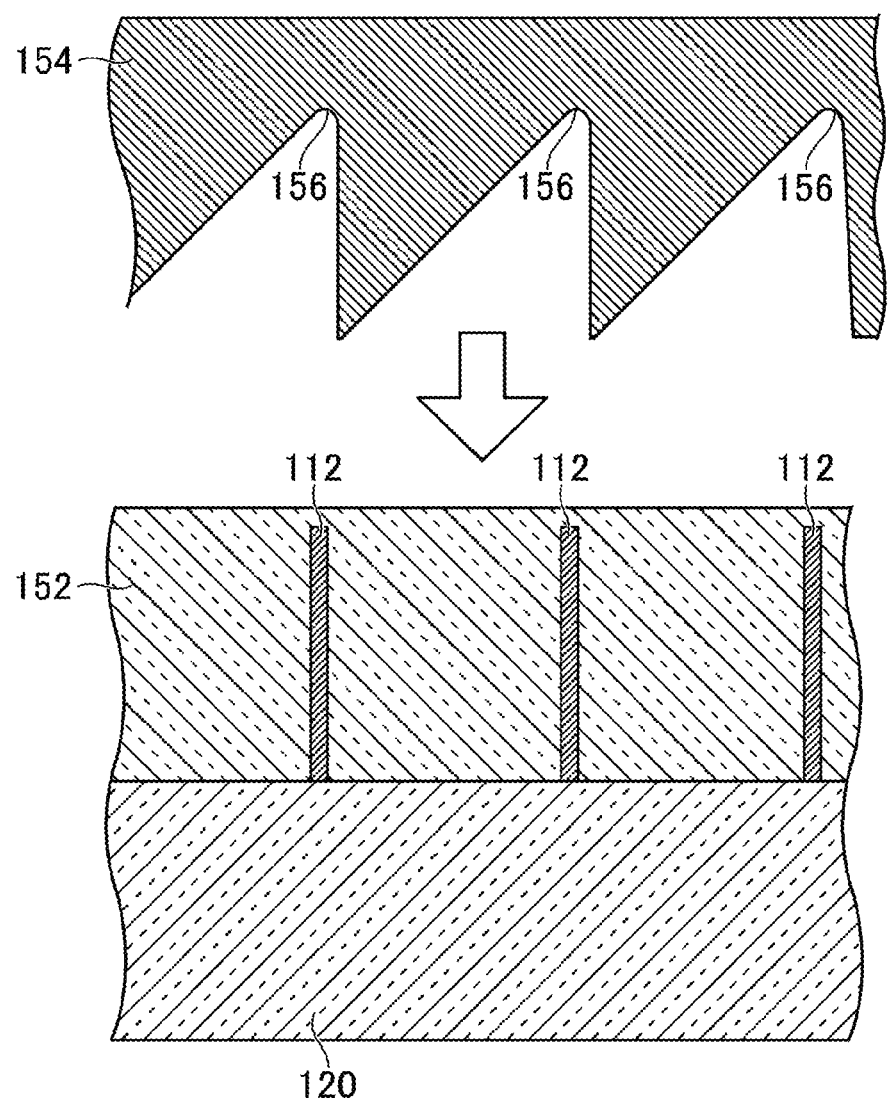

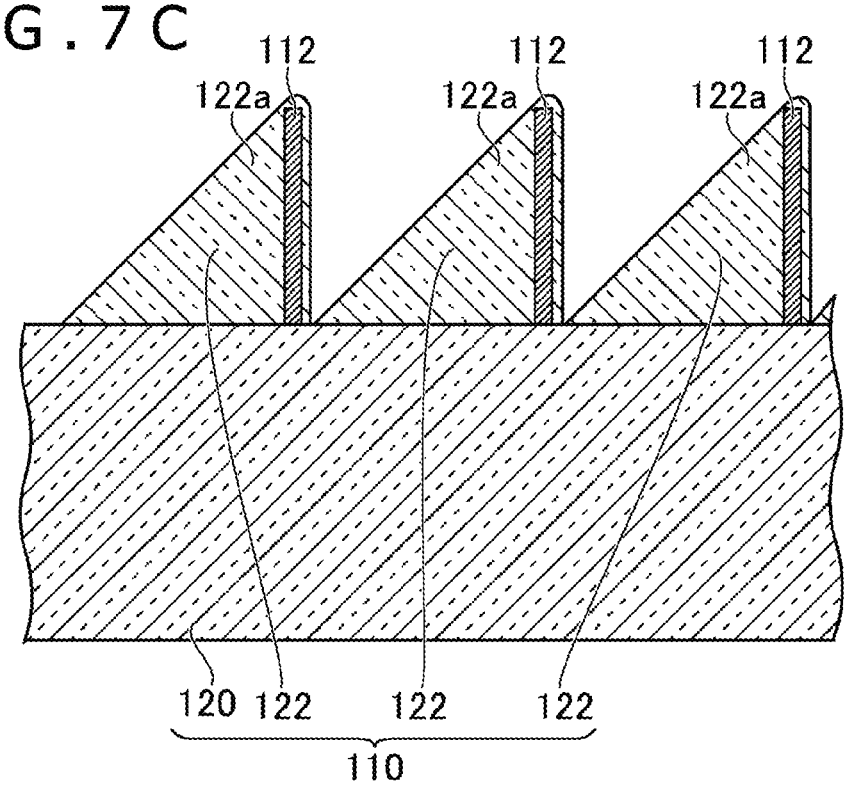

FRESNEL LENS AND MANUFACTURING METHOD FOR FRESNEL LENS

TECHNICAL FIELD

The present invention relates to a Fresnel lens and a method of manufacturing the Fresnel lens.

BACKGROUND ART

There is known a technique relating to enhancement of the image quality of an image visually recognized through a Fresnel lens in which a plurality of protruding lens portions are concentrically, continuously formed. For example, PTL 1 to PTL 7 each describe a technique with which a light absorbing portion is provided on a rise surface of a Fresnel lens, thereby enhancing the image quality of an image visually recognized through the Fresnel lens. PTL 8 describes a technique with which a transmittance in the vicinity of an end portion in a width direction of a cycle is made smaller than a transmittance in the vicinity of a central portion in the width direction, thereby suppressing the generation of stripe flare light, although this is an example of a technique not relating to the Fresnel lens, but relating to a diffraction grating lens.

CITATION LIST

Patent Literature

[PTL 1] JP 2015-59959A
[PTL 2] JP 2006-39146A
[PTL 3] JP 2002-277614A
[PTL 4] JP 2002-182012A
[PTL 5] JP 1996-136707A
[PTL 6] JP 1995-306307A
[PTL 7] JP 1994-250003A
[PTL 8] WO2011/86654A1

SUMMARY

Technical Problem

In the case where a Fresnel lens is formed by molding through, for example, injection molding, a surface of a top portion of a lens portion is curved. Then, light is transmitted through such a top portion, whereby a flare which extends toward a center of a lens is generated in an image visually recognized through the Fresnel lens in some cases.

For the enhancement of the image quality of the image visually recognized through the Fresnel lens, it is desirable that the generation of such a flare can be suppressed. However, with the techniques described in PTL 1 to PTL 8 described above, the suppression of the flare described above which is generated by the top portion of the lens portion is not carried out.

The present invention has been made in the light of the actual situation described above, and one of objects thereof is to provide a Fresnel lens and a method of manufacturing the Fresnel lens which can suppress a flare which is generated in an image visually recognized through the Fresnel lens so as to extend toward a center of a lens.

Solution to Problem

In order to solve the problem described above, a Fresnel lens according to the present invention is a Fresnel lens in which a plurality of protruding lens portions are concentrically, continuously formed. In this case, a lens surface and a non-lens surface are formed in each of the lens portions, the non-lens surface includes a rise surface and a coupling surface, and the rise surface is a surface along an optical axis of the Fresnel lens. In addition, the coupling surface is a surface which is formed on a top portion of each of the lens portions so as to couple the lens surface of the lens portion and the rise surface of the lens portion to each other and which has a width extending in a radial direction of the Fresnel lens, and a light absorbing portion is provided in a position along the optical axis of the Fresnel lens which passes through the coupling surface.

In an aspect of the present invention, the light absorbing portion is formed on the coupling surface.

In this aspect, the coupling surface may be a flat surface vertical to the optical axis of the Fresnel lens.

In addition, in the aspect of the present invention, the light absorbing portion is formed in an inside of each of the lens portions.

In addition, a method of manufacturing a Fresnel lens according to the present invention includes: a process for forming a main body portion in which a plurality of protruding lens portions are concentrically, continuously formed; a process for covering a surface of each of the lens portions with a mask; a process for exposing a top portion of each of the lens portions from the mask; a process for forming a light absorbing portion on the mask and the exposed top portion; and a process for removing the mask while leaving the light absorbing portion formed on the top portion.

In an aspect of the present invention, in the process for exposing the top portion, the top portion having a curved shape is flattened by polishing the mask and the top portion.

Another method of manufacturing a Fresnel lens according to the present invention is a method of manufacturing a Fresnel lens in which a plurality of protruding lens portions are concentrically, continuously formed. In this case, the manufacturing method includes: a process for arranging a light absorbing material concentrically on a transparent base; a process for covering the material with a transparent material; and a process for molding the transparent material into each of the lens portions. In this case, in the molding process, the transparent material is molded into the lens portion in such a way that the material is arranged in a position along an optical axis of the Fresnel lens which passes through a top portion of the lens portion.

BRIEF DESCRIPTION OF DRAWINGS

FIG. 4B is a process chart schematically depicting the example of the method of manufacturing a Fresnel lens according to the embodiment of the present invention.

FIG. 5 is an explanatory view schematically depicting an example of a mode of use of the Fresnel lens according to the embodiment of the present invention.

FIG. 7A is a process chart schematically depicting an example of a method of manufacturing a Fresnel lens according to the another embodiment of the present invention.

FIG. 7B is a process chart schematically depicting the example of the method of manufacturing a Fresnel lens according to the another embodiment of the present invention.

FIG. 7C is a process chart schematically depicting the example of the method of manufacturing a Fresnel lens according to the another embodiment of the present invention.

DESCRIPTION OF EMBODIMENTS

Hereinafter, an embodiment of the present invention will be described with reference to the drawings.

Figure 1:
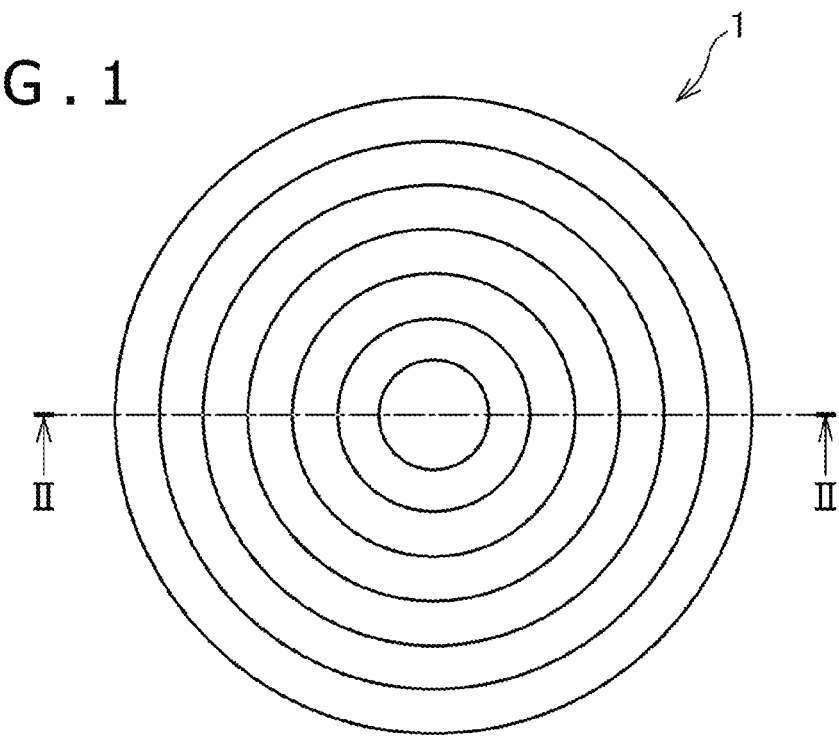
FIG. 1 is a top plan view schematically depicting an example of a Fresnel lens according to an embodiment of the present invention.
Figure 2:
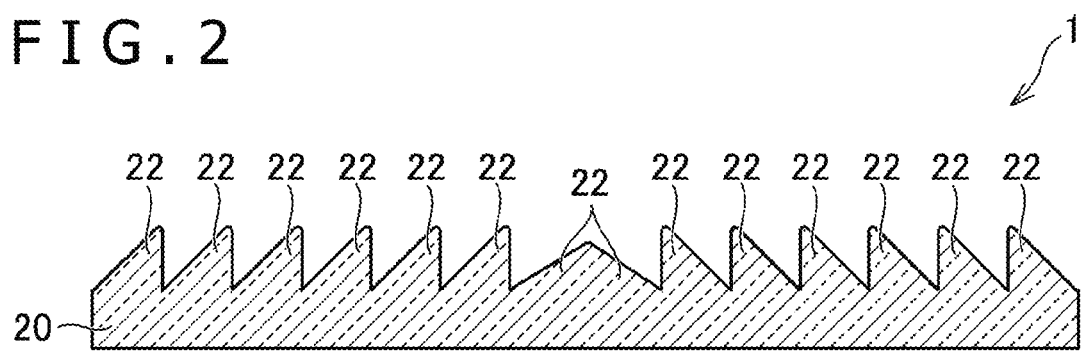
FIG. 2 is a cross-sectional view taken on line II-II of the Fresnel lens exemplified in FIG. 1.
Figure 3:
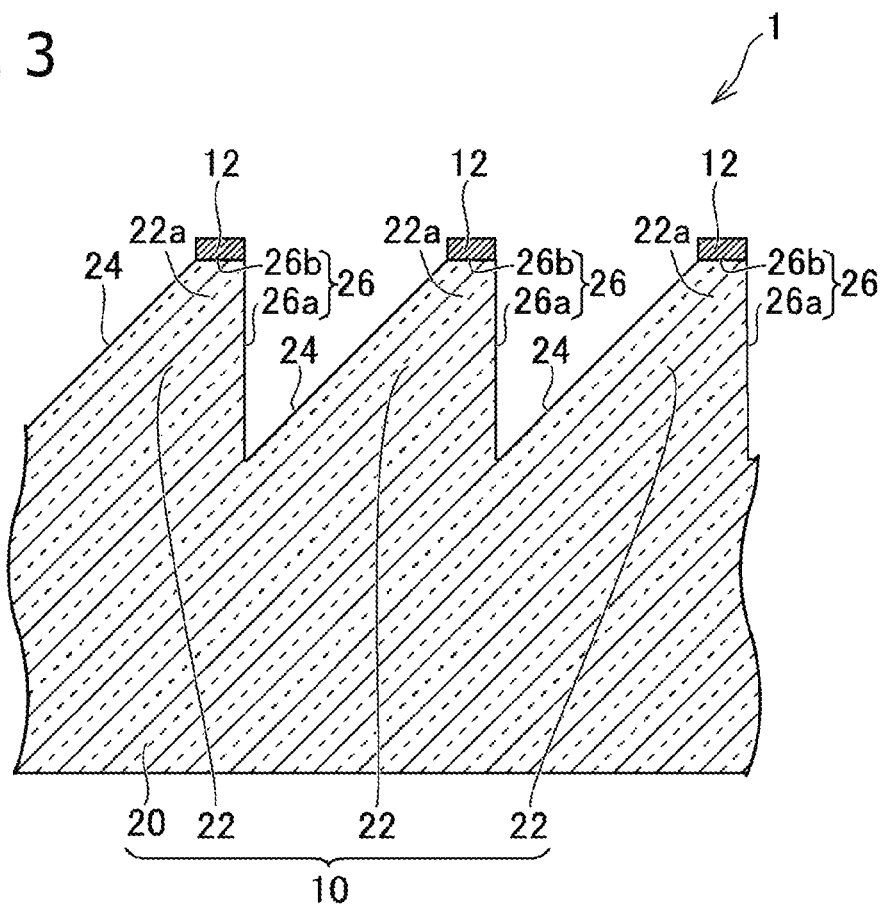
FIG. 3 is a partially enlarged cross-sectional view of the Fresnel lens exemplified in FIG. 1 and FIG. 2.

FIG. 1 is a top plan view schematically depicting an example of a Fresnel lens 1 according to the embodiment of the present invention. FIG. 2 is a cross-sectional view taken on line II-II of the Fresnel lens 1 exemplified in FIG. 1. FIG. 3 is a partially enlarged cross-sectional view of the Fresnel lens 1 exemplified in FIG. 1 and FIG. 2.

The Fresnel lens 1 according to the present embodiment includes a main body portion 10 and a light absorbing portion 12. The main body portion 10 is made of a transparent resin and, for example, is configured to contain acryl, cyclic olefin copolymer, cycloolefin polymer, pre-carbonate or the like. Incidentally, all it takes is that the main body portion 10 is transparent and, for example, may be made of a glass.

The main body portion 10 includes a base 20 and a plurality of protruding lens portions 22. Then, the plurality of protruding lens portions 22 are continuously, radially formed in a concentric shape (in this case, for example, in a concentric circular shape) on the base 20. In addition, a cross section of the main body portion 10 has a serrated shape as a whole.

A lens surface 24 (valid surface) which functions as a protruding lens in the Fresnel lens 1, and a non-lens surface 26 (invalid surface) which does not function as a protruding lens are formed in each of the lens portions 22. The lens surface 24 is a surface which is made to correspond to a part of the surface of the protruding lens corresponding to the Fresnel lens 1. The non-lens surface 26 is a surface which is not made to correspond to the part of the surface of the protruding lens corresponding to the Fresnel lens 1. In addition, the non-lens surface 26 includes a rise surface 26a as a surface which rises along an optical axis of the Fresnel lens 1, and a coupling surface 26b which couples the lens surface 24 and the rise surface 26a to each other. As depicted in FIG. 3, the coupling surface 26b pertaining to the present embodiment is a flat surface which is formed in a top portion 22a of the lens portion 22 and is vertical to the optical axis of the Fresnel lens 1.

Then, in the present embodiment, the light absorbing portion 12 is formed on the coupling surface 26b. The light absorbing portion 12 pertaining to the present embodiment, for example, is configured to contain a light absorbing material such as paint such as carbon black, or minute carbon nanotubes. It should be noted that the light absorbing portion 12, for example, may be made of a member such as a metal as long as the member neither transmits nor reflects the light.

In the Fresnel lens 1 according to the present embodiment, as depicted in FIG. 3, the light absorbing portion 12 is formed in a position along the optical axis of the Fresnel lens 1 which passes through the coupling surface 26b. Therefore, the light which travels toward the top portion 22a along the optical axis of the Fresnel lens 1 is absorbed and blocked by the light absorbing portion 12. For this reason, according to the Fresnel lens 1 of the present embodiment, it is possible to suppress a flare which is generated due to the transmission of the light through the top portion 22a so as to extend toward the center of the lens in an image visually recognized through the Fresnel lens 1. In the case where, the Fresnel lens 1 is formed by, for example, molding through the injection molding or the like, the top portion 22a is curved in a rounded shape due to the filling insufficiency or the like of the material in a molded article to generate a so-called vertex undercut. According to the Fresnel lens 1 of the present embodiment, it is possible to suppress the flare which is generated due to such curving of the top portion 22a so as to extend toward the center of the lens in the image visually recognized through the Fresnel lens 1.

Hereinafter, a description will be given with respect to an example of processes for manufacturing the Fresnel lens 1 according to the present embodiment with reference to FIG. 4A to FIG. 4D.

Figure 4A:
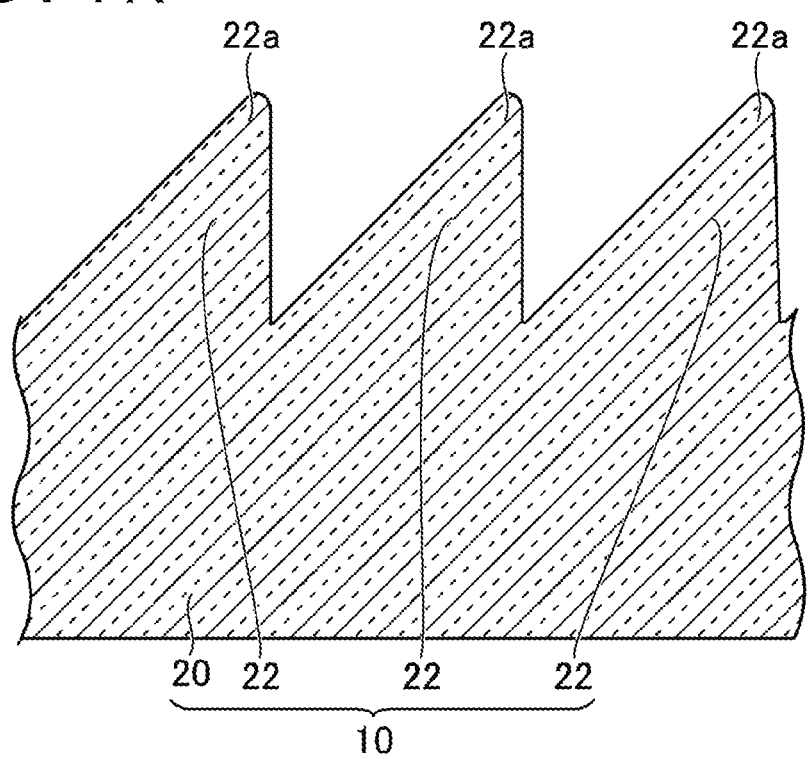
FIG. 4A is a process chart schematically depicting an example of a method of manufacturing a Fresnel lens according to an embodiment of the present invention.

Firstly, the main body portion 10 which includes the base 20 and the plurality of protruding lens portions 22 and in which the lens portions 22 are continuously formed in a concentric shape as depicted in FIG. 4A is formed by the injection molding, the press molding or the like. It should be noted that the top portion 22a of the lens portion 22 depicted in FIG. 4A has a curved shape in which an upper side is protruding. Incidentally, a casting method for the main body portion 10 especially does not matter.

Then, the surface of the lens portion 22 is covered with a mask 30 made of a resin or the like as depicted in FIG. 4B.

Figure 4C:
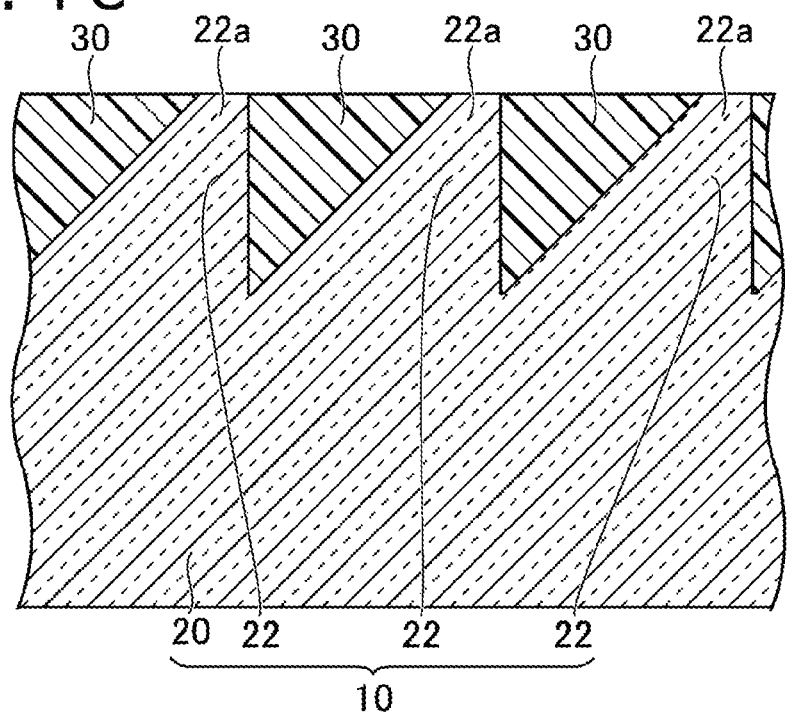
FIG. 4C is a process chart schematically depicting the example of the method of manufacturing a Fresnel lens according to the embodiment of the present invention.

Then, the polishing or the like of the mask 30 and the top portion 22a of the lens portion 22 results in that, as depicted in FIG. 4C, the top portion 22a is exposed from the mask 30. It should be noted that in this case, for example, the top portion 22a may be exposed from the mask 30 by cutting the mask 30 and the top portion 22a. In addition, in the present embodiment, the top portion 22a having the curved shape in which the upper side is protruding shall be flattened in this process.

Figure 4D:
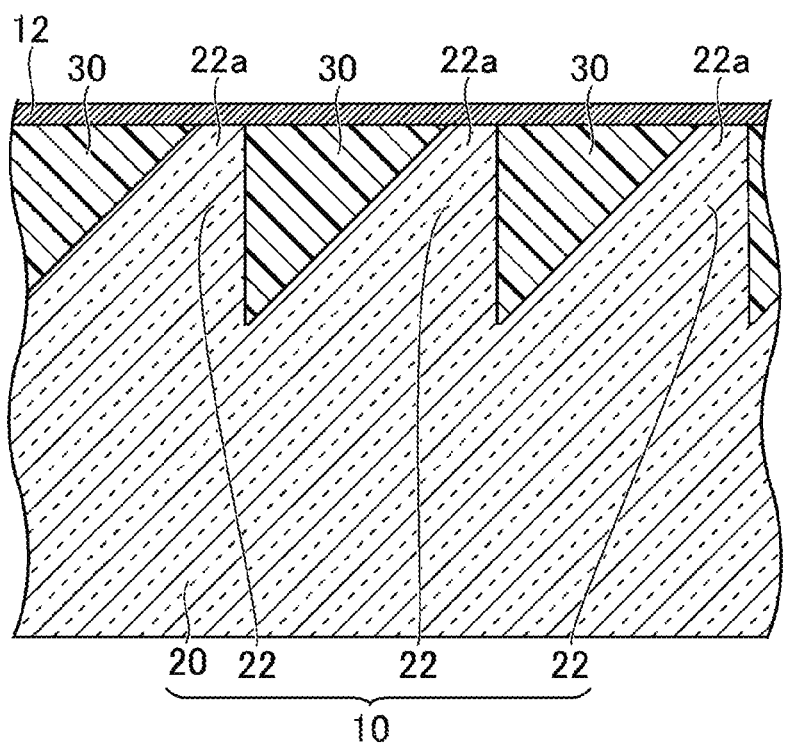
FIG. 4D is a process chart schematically depicting the example of the method of manufacturing a Fresnel lens according to the embodiment of the present invention.

Then, as depicted in FIG. 4D, the light absorbing portion 12 is formed on the mask 30 and the exposed top portion 22a. In this case, for example, black paint such as carbon black is applied.

Then, the mask 30 is removed away while the light absorbing portion 12 formed on the top portion 22a is left, thereby manufacturing the Fresnel lens 1 depicted in FIG. 3.

It should be noted that in the manufacturing processes described above, a resin having such a property as to be self-peeled off by application of heat may be used as the mask 30. In this case, the application of the heat results in that the mask 30 on which the light absorbing portion 12 is formed is removed away (peeled off) from the main body portion 10.

In the manufacturing processes described above, a resin having such a property as to be chemically dissolved in a solvent may be used as the mask 30. In this case, immersing the structure depicted in FIG. 4D in the solvent results in that the mask 30 on which the light absorbing portion 12 is formed is removed away (peeled off) from the main body portion 10.

In the manufacturing processes described above, a resin which should be peeled off with a tape may be used as the mask 30. In this case, a tape is stuck from the upper side and is then peeled off, thereby removing away (peeling off) the mask 30 on which the light absorbing portion 12 is formed from the main body portion 10.

Incidentally, when the top portion 22a is exposed, a fine pattern such as the moth-eye structure, for example, may be formed on the exposed top portion 22a by an etching process or the like. Alternatively, for example, the formation of the cutting processing mesh, the sanding, the sandblast or the like may be carried out for the exposed top portion 22a, thereby forming a fine corrugated surface. If such a process is carried out, then, the possibility that in the removal of the mask 30, the light absorbing portion 12 formed on the top portion 22a is peeled off together with the mask 30 is reduced due to the anchor effect. In addition, the light quantity of the light reflected by the coupling surface 26b is suppressed.

FIG. 5 is an explanatory view schematically depicting an example of a mode of use of the Fresnel lens 1 according to the present embodiment. As depicted in FIG. 3, the light absorbing portion 12 is formed in a concentric shape (in this case, for example, in a concentric circular shape) in the Fresnel lens 1 according to the present embodiment. Here, for example, as depicted in FIG. 5, it is assumed that the Fresnel lens 1 according to the present embodiment is used in a use application for enlarging an image displayed on a display portion 40 in a head mounted display (HMD). In this case, as depicted in FIG. 5, a distance between each of points 42 of view of a user and the Fresnel lens 1 is shorter than a distance between the Fresnel lens 1 and the display portion 40. For this reason, even if the user visually recognizes the image displayed on the display portion 40 through the Fresnel lens 1 according to the present embodiment, then, he/she does not mind about the presence of the light absorbing portion 12.

Hereinafter, a description will be given with respect to another embodiment of the present invention with reference to the drawings.

Figure 6:
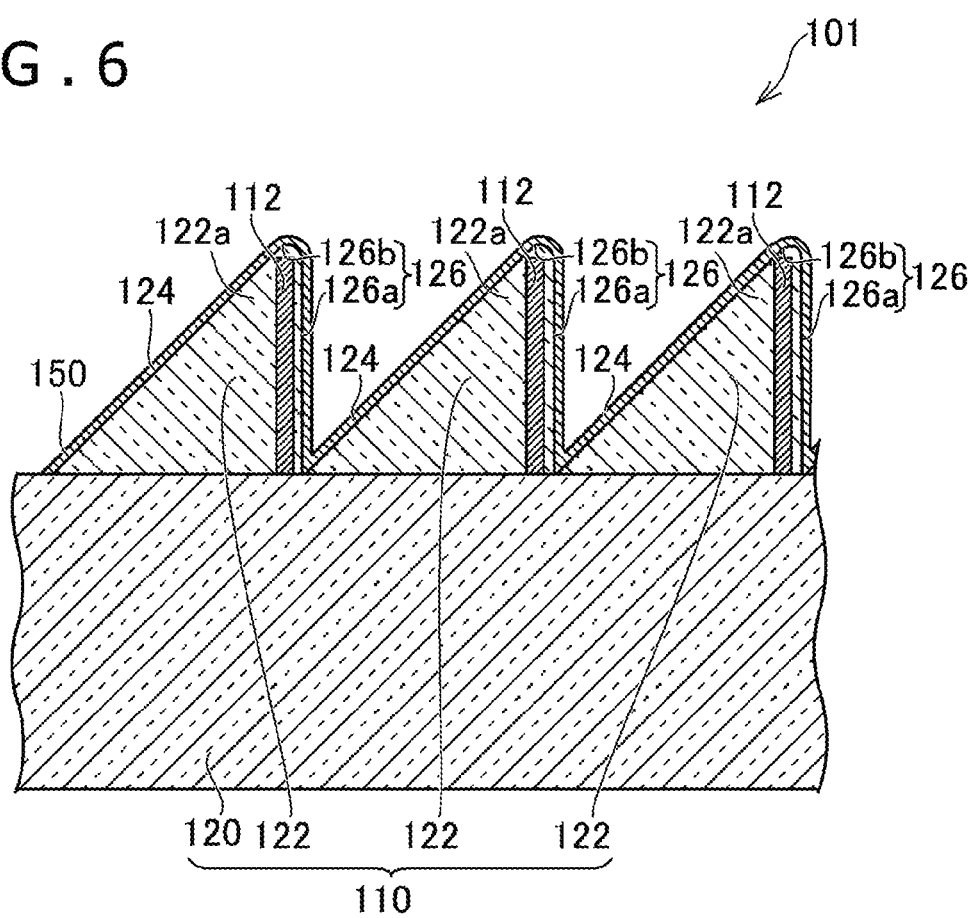
FIG. 6 is a partially enlarged cross-sectional view depicting an example of the Fresnel lens according to another embodiment of the present invention.

FIG. 6 is a partially enlarged cross-sectional view depicting an example of a Fresnel lens 101 according to another embodiment of the present invention. The Fresnel lens 101 depicted in FIG. 6 includes a main body portion 110 and a light absorbing portion 112. The main body portion 110 pertaining to the present embodiment includes a base 120 as a transparent flat plate, and a plurality of protruding lens portions 122. Similarly to the main body portion 10 depicted in FIG. 3, the main body portion 110 is made of a transparent resin. The plurality of protruding lens portions 122 are continuously formed in a concentric shape (in this case, for example, in a concentric circular shape) in the main body portion 110. In addition, a cross section of the main body portion 110 has a serrated shape as a whole.

A lens surface 124 similar to the lens surface 24 depicted in FIG. 3, and a non-lens surface 126 similar to the non-lens surface 26 depicted in FIG. 3 are formed in each of the lens portions 122. In addition, the non-lens surface 126 includes a rise surface 126a as a surface along an optical axis of the Fresnel lens 101, and a coupling surface 126b for coupling the lens surface 124 and the rise surface 126a to each other. As depicted in FIG. 6, the coupling surface 126b pertaining to the present embodiment is formed on a top portion 122a of the lens portion 122 and has a curved shape in which an upper side is protruding.

Then, in the present embodiment, the light absorbing portion 112 is provided in a position along the optical axis of the Fresnel lens 101 which passes through the coupling surface 126b. In addition, the light absorbing portions 112 pertaining to the present embodiment, as depicted in FIG. 6, are arranged in a concentric tubular shape (in this case, for example, in a concentric cylindrical shape) in the insides, of the respective lens portions 122, as the vicinities of inner sides in a radial direction of the rise surfaces 126a. The light absorbing portion 112 is configured to contain a light absorbing material and, for example, contains carbon nanotubes, carbon particles or the like. In addition, the light absorbing portion 112 may be configured to contain a material which absorbs the visible light and transmits the ultraviolet rays.

The Fresnel lens 101 according to the present embodiment is provided with the light absorbing portion 112 in the position along the optical axis of the Fresnel lens 101 which passes through the coupling surface 126b. For this reason, the light which travels toward the top portion 122a along the optical axis of the Fresnel lens 101 is absorbed and blocked by the light absorbing portion 112. For this reason, according to the Fresnel lens 101 of the present embodiment, it is possible to suppress a flare which is generated due to the transmission of the light through the top portion 122a so as to extend toward the center of the lens in an image visually recognized through the Fresnel lens 101.

In the Fresnel lens 101 according to the present embodiment, an antireflection film 150 for suppressing the reflection of the light made incident from the outside to the lens portion 122 is formed on the surface on the side of the lens surface 124 and the non-lens surface 126 of the lens portion 122.

It should be noted that in the present embodiment, the refractive indices of the base 120, the lens portion 122, and the light absorbing portion 112 are desirably identical to one another. When such a configuration is adopted, the reflection of the light made incident to the light absorbing portion 112 shall be suppressed.

Hereinafter, a description will be given with respect to an example of processes for manufacturing the Fresnel lens 101 according to the present embodiment with reference to FIG. 7A to FIG. 7C.

Firstly, as depicted in FIG. 7A, the light absorbing portions 112 each made of a light absorbing material are arranged in a concentric shape (in this case, for example, in a concentric circular shape) on the transparent base 120 by using a nanoimprint technology or the like. It should be noted that a width of each of the light absorbing portions 112, for example, is 20 μm, and a height of each of the light absorbing portions 112, for example, is 250 μm.

Then, as depicted in FIG. 7B, the light absorbing portions 112 are covered with a transparent material 152 made of a transparent resin.

Then, as depicted in FIG. 7B, the positioning of a mold (in this case, for example, a metallic mold 154) is carried out. In this case, for example, the metallic mold is positioned in such a way that a portion (for example, a recessed portion 156) of the metallic mold 154 which forms the top portion 122a is arranged in a position along the optical axis of the Fresnel lens 101 (for example, on an upper side along the optical axis of the Fresnel lens 101).

Then, the mold (in this case, for example, the metallic mold 154) is moved downward along the optical axis of the Fresnel lens 101 to press the transparent material 152, thereby molding the transparent material 152 into the lens portion 122 as depicted in FIG. 7C. In this process, the transparent material 152 is molded into the lens portion 122 in such a way that the light absorbing portion 112 is arranged in the position along the optical axis of the Fresnel lens 101 which passes through the top portion 122a of the lens portion 122.

Then, the antireflection film 150 for suppressing the reflection of the light made incident from the outside to the lens portion 122 is applied to the surface on the side of the lens surface 124 and the non-lens surface 126 of the lens portion 122, thereby manufacturing the Fresnel lens 101 depicted in FIG. 6.

It should be noted that the present invention is by no means limited to the embodiments described above.

Figure 8:
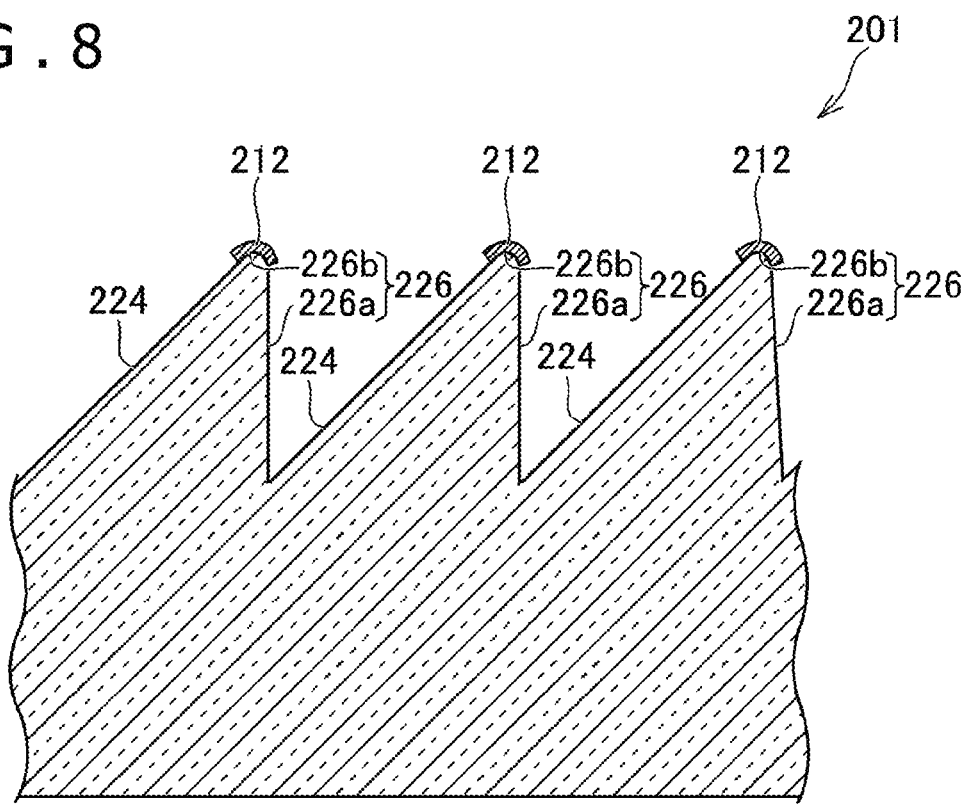
FIG. 8 is a partially enlarged cross-sectional view depicting an example of a Fresnel lens according to still another embodiment of the present invention.

For example, like a Fresnel lens 201 exemplified in FIG. 8, a light absorbing portion 212 may be formed on a coupling surface 226b, having a curved shape in which an upper side is protruding, for coupling a lens surface 224 and a rise surface 226a to each other.

Figure 9:
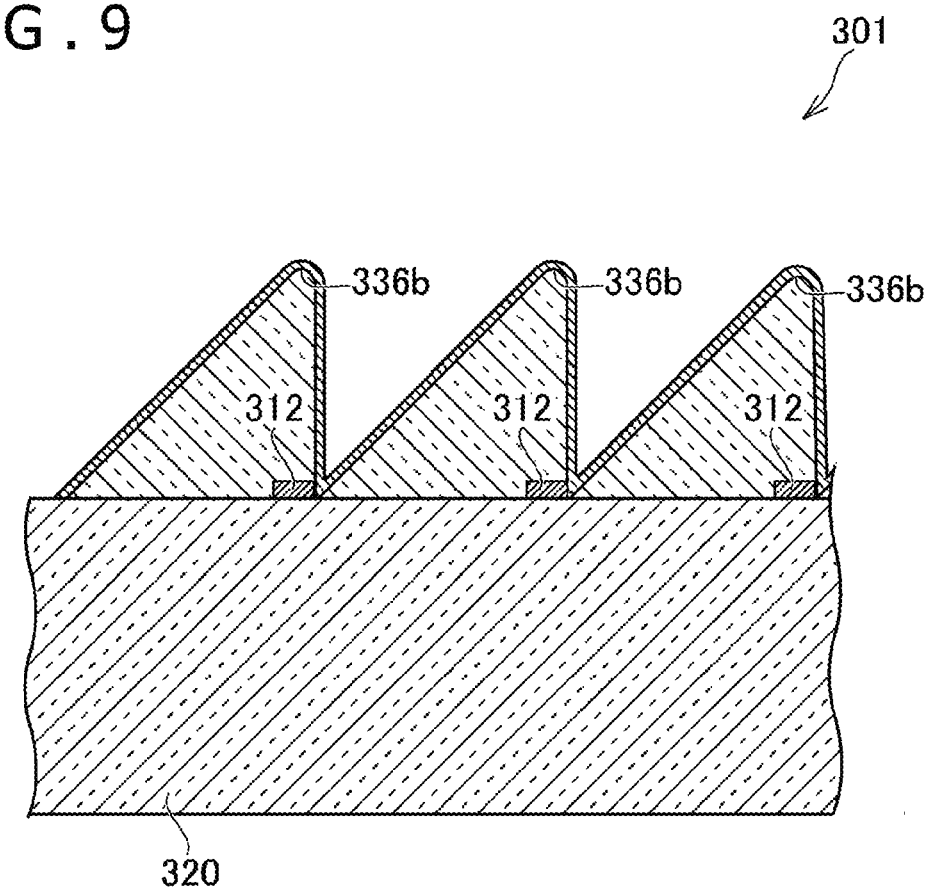
FIG. 9 is a partially enlarged cross-sectional view depicting an example of a Fresnel lens according to yet another embodiment of the present invention.

In addition, for example, like a Fresnel lens 301 exemplified in FIG. 9, a light absorbing portion 312 as a light blocking pattern may be printed on a position on a base 320 along an optical axis of the Fresnel lens 301 which passes through a coupling surface 336b.

Figure 10:
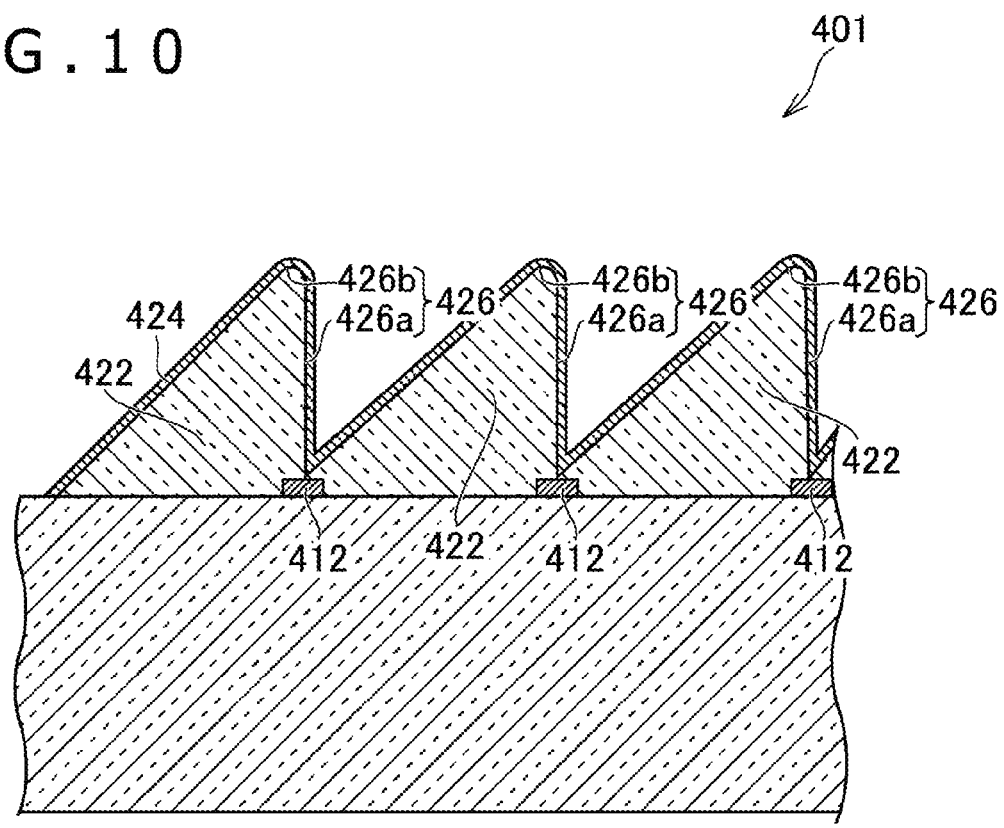
FIG. 10 is a partially enlarged cross-sectional view depicting an example of a Fresnel lens according to a further embodiment of the present invention.

In addition, for example, like a Fresnel lens 401 exemplified in FIG. 10, a light absorbing portion 412 may be arranged. The light absorbing portion 412 is continuously arranged so as to extend from a position along an optical axis of the Fresnel lens 401 which passes through a coupling surface 426b of a lens portion 422 to a position along an optical axis of the Fresnel lens 401 which passes through a lens surface 424 of an adjacent lens portion 422. If such a configuration is adopted, then, for example, light reflected by a rise surface 426a shall be absorbed by the light absorbing portion 412.

Figure 11:
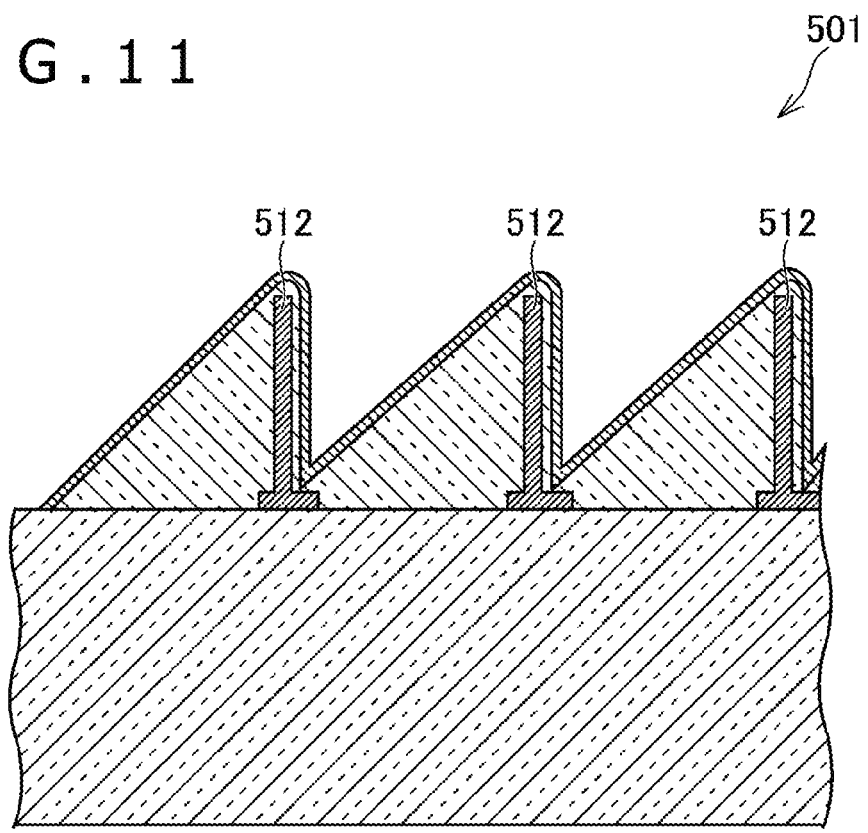
FIG. 11 is a partially enlarged cross-sectional view depicting an example of a Fresnel lens according to an even further embodiment of the present invention.
Figure 12:
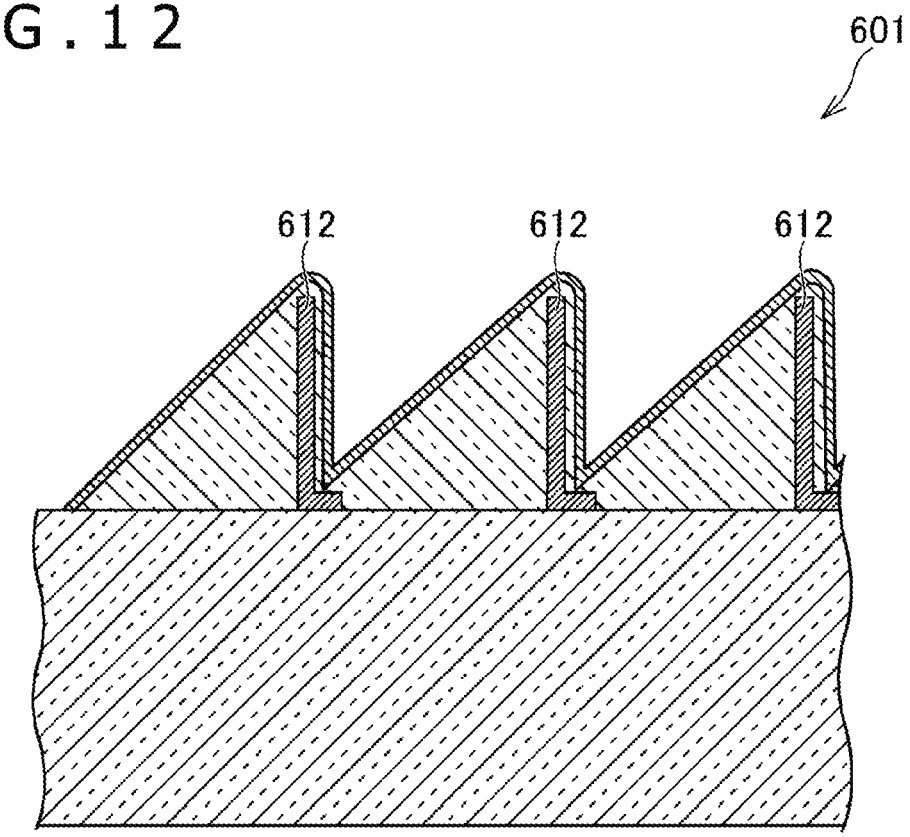
FIG. 12 is a partially enlarged cross-sectional view depicting an example of a Fresnel lens according to a still further embodiment of the present invention.

In addition, for example, like a Fresnel lens 501 exemplified in FIG. 11, a light absorbing portion 512 may have a T-letter shape in cross section. In addition, like a Fresnel lens 601 exemplified in FIG. 12, a light absorbing portion 612 may have an L-letter shape in cross section. The light absorbing portion 512 depicted in FIG. 11 and the light absorbing portion 612 depicted in FIG. 12 are also continuously arranged so as to extend from a position along an optical axis of the Fresnel lens to a position along an optical axis of the Fresnel lens which passes through a lens surface of an adjacent lens portion.

In addition, the embodiments which have been described so far may be suitably combined with one another. For example, a Fresnel lens provided with a plurality of light absorbing portions different from one another from among the light absorbing portion 12, the light absorbing portion 112, the light absorbing portion 212, the light absorbing portion 312, the light absorbing portion 412, the light absorbing portion 512, and the light absorbing portion 612 may be configured.

In addition, the Fresnel lens according to the embodiments does not need to be a circle in shape as described above and, for example, may be a square in shape.

In addition, concrete character strings or numerical values described above, and concrete character strings or numerical values in the drawings are merely exemplifications, and the present invention is by no means limited to these character strings or numerical values.

The invention claimed is:

1. A Fresnel lens in which a plurality of protruding lens portions are concentrically, continuously formed,
    wherein a lens surface and a non-lens surface are formed in each of the lens portions,
    the non-lens surface includes a rise surface and a coupling surface,
    the rise surface is a surface along an optical axis of the Fresnel lens, and
    the coupling surface is a surface which is formed on a top portion of each of the lens portions so as to couple the lens surface of the lens portion and the rise surface of the lens portion to each other, and which has a width extending parallel to a radial direction of the Fresnel lens, and
    a light absorbing portion is provided in a position along the optical axis of the Fresnel lens which passes through the coupling surface.

2. The Fresnel lens according to claim 1, wherein the light absorbing portion is formed on the coupling surface.

3. The Fresnel lens according to claim 2, wherein the coupling surface is a flat surface vertical to the optical axis of the Fresnel lens.

4. The Fresnel lens according to claim 1, wherein the light absorbing portion is formed in an inside of each of the lens portions.

* * * * *